United States Patent [19]
Yanagi et al.

[11] Patent Number: 5,981,442
[45] Date of Patent: Nov. 9, 1999

[54] NEODYMIUM-BARIUM-COPPER-OXIDE BULK SUPERCONDUCTOR AND PROCESS FOR PRODUCING THE SAME

[75] Inventors: Yousuke Yanagi, Chiryu; Takeo Yamazaki, Nagoya; Atsushi Takagi, Nagoya; Yuh Yamada, Nagoya; Uichiro Mizutani, Nagoya; Yoshitaka Itoh, Chiryu; Masaaki Yoshikawa, Toyota; Tetsuo Oka, Obu, all of Japan

[73] Assignee: Aisin Seiki Kabushiki Kaisha, Kariya, Japan

[21] Appl. No.: 09/151,807

[22] Filed: Sep. 14, 1998

Related U.S. Application Data

[63] Continuation of application No. 08/654,238, May 28, 1996, abandoned.

[30]    Foreign Application Priority Data

May 26, 1995  [JP]  Japan ................................... 7-128667

[51] Int. Cl.$^6$ .................................................. C04B 35/653
[52] U.S. Cl. .......................... 505/126; 505/450; 505/500; 505/785
[58] Field of Search ...................... 505/125, 126, 505/785, 450, 500, 742; 252/519.1, 521.1

[56]          References Cited

U.S. PATENT DOCUMENTS

| | | |
|---|---|---|
| 4,942,151 | 7/1990 | Capone et al. ............................. 505/1 |
| 5,114,905 | 5/1992 | Giessen et al. ............................. 505/1 |
| 5,525,584 | 6/1996 | Murakami et al. ...................... 505/450 |

OTHER PUBLICATIONS

Superconduct. Sci. Technol. 9 (1996) 1015–1032. "Topical Review, Melt–processed light rate earch element--Ba–Cu–O"; M Murakami, et al, Jun., 1996.

*Primary Examiner*—Mark Kopec
*Attorney, Agent, or Firm*—Oblon, Spivak, McClelland, Maier & Neustadt, P.C.

[57]          ABSTRACT

An Nd-Ba-Cu-O bulk superconductor includes oxide including metallic elements of neodymium (Nd), barium (Ba) and copper (Cu), and has a structure in which fine particles of $Nd_4Ba_2Cu_2O_{10}$ (i.e., Nd422) are dispersed uniformly in crystalline grains of $NdBa_2Cu_3O_x$ (i.e., Nd123). It is produced by preparing a mixture powder in which an Nd123 powder and an Nd422 powder are present uniformly, thermally treating the mixture powder in a temperature range where the Nd123 powder melts partially at least but the Nd422 powder hardly melts, and gradually cooling the partially melted mixture powder in a temperature range around a solidifying point of the Nd123 powder. It exhibits an enhanced magnetic-field-trapping capability in the regions of low magnetic field, because of the pinning effect resulting from the fine particles of Nd422 dispersed uniformly in the crystalline grains of Nd123.

25 Claims, 4 Drawing Sheets

NEODYMIUM-BARIUM-COPPER-OXIDE BULK SUPERCONDUCTOR AND PROCESS FOR PRODUCING THE SAME

This application is a Continuation of application Ser. No. 08/654,238, filed on May 28, 1996, now abandoned.

BACKGROUND OF THE INVENTION

1. Field of the Invention

The present invention relates to a melt-textured bulk comprising a neodymium-barium-copper-oxide superconductor (hereinafter referred to as "Nd-Ba-Cu-O superconductor", i.e., one of RE-Ba-Cu-O superconductors), and a process for producing the same.

The present invention provides a bulk superconductor exhibiting a high critical current density over a wide range of magnetic field. Thus, the bulk superconductor can be used in a variety of industries. For instance, the bulk superconductor can be applied to a magnet by trapping a magnetic field, a transferring system by means of magnetic levitation, a flywheel, and an electric power storage system.

2. Description of Related Art

The group of RE-Ba-Cu-O superconductors ("RE" herein stands for a rare-earth element) have recently come to exhibit a high critical current density (hereinafter simply referred to as "Jc"), and can trap a high magnetic field of more than 1 T at a liquid nitrogen temperature. These advantages are effected by establishing the following structure; namely: $RE_2BaCuO_5$ phases (or RE211 phases), non-superconductive phases, are dispersed in largely grown $REBa_2Cu_3O_x$ phases (or RE123 phases) grain, superconductive phases. Melting processes have been developed in order to establish this structure. There are a few manufacturing processes which can be classified into the melting process. The manufacturing processes commonly own the following characteristics; namely: the starting materials are synthesized to have deviated compositions which enable to leave the RE211 phases in the structure of the resulting materials after a heat treatment; the starting materials are heated to a temperature at which the RE123 phases incongruently melt to RE211 phase and liquid phases including Ba, Cu, and O; and thereafter these phases are cooled gradually from a temperature around which the RE123 phases solidify, thereby growing large crystalline grains of RE123 phase.

In accordance with the melting processes, it is possible to produce superconductors capable of trapping a large magnetic field which cannot be obtained by permanent magnets. New applications can be expected from such superconductors, and accordingly many researches and developments have been carried out onto the melting processes. As a result, it has been found out that it is necessary to grow the crystalline grains of RE123 phase largely, and to make the RE211 phases, remaining in the RE123 matrix, finer in order to produce a melt-textured bulk with good characteristic. It is believed that the RE211 phases (i.e., the non-superconductive phases) which are dispersed in the crystalline grains of the RE123 phases (i.e., the superconductive phases) work as magnetic-flux-pinning centers substantially. Accordingly, the larger the number of the particles of RE211 phase is, the stronger the magnetic flux can be pinned. Moreover, Japanese Unexamined Patent Publication (KOKAI) No. 5-279,032 discloses that Pt or Rh can be effectively added to make the RE211 phase finer. The publication suggests a process for producing an oxide superconductor which comprises the steps of adding a trace amount of a platinum powder to a raw mixed powder which includes RE, Ba, Cu or their compounds, and mixing and forming the resulting powder; and carrying out a heat treatment onto the resulting compaction. The heat treatment includes partially-melting, and gradually-cooling the compaction.

The conventional melt-textured bulk superconductors exhibit a high Jc in regions of low external magnetic field. However, they tend to exhibit a decreasing Jc as the external magnetic field increases. Thus, there arises a problem in that the conventional melt-textured bulk superconductors cannot exhibit a satisfactory Jc in regions of high external magnetic field.

In addition, researches and developments on Nd-Ba-Cu-O superconductors have been actively carried out recently. In the Nd-Ba-Cu-O superconductors, the Nd elements partially substituted for the Ba-sites of $NdBa_2Cu_3O_x$ (i.e., Nd123). Consequently, only the Nd-Ba-Cu-O superconductors of unsatisfactory characteristic have been produced by a heat treatment in air, or in oxygen atmosphere, heat treatment which has been usually used to produce other RE123 oxide superconductors. For example, the thus produced Nd123 exhibits a Tc (i.e., a superconducting transition temperature) lower than those of the $YBa_2Cu_3O_x$ superconductors.

However, when the heat treatment is carried out by suppressing the partial pressure of oxygen, the Nd elements are inhibited from substituting for the Ba-sites. Accordingly, the Nd123 was found to exhibit a Tc higher than that of the other RE123. Moreover, Murakami et al. report in pages 368 through 371, volume 64, #4 of the journal of "OHYO BUTSURI (Applied Physics)" Society that the crystalline grains of single Nd123 phase exhibit a high Jc even in regions of high external magnetic field, because the crystalline grains effect magnetic-flux pinning induced by the magnetic field. When the Nd123 incongruently melts to liquid phase and solid phase, the compositions of the solid phase are identical with that of the RE211 phases. However, the solid phase resulting from the incongruent melting of the Nd 123 has been found to have a crystalline structure which differs from that of the other RE211 phases. In order to clarify the phenomena, the phases resulting from the incongruent melting of the Nd123 are called $Nd_4Ba_2Cu_2O_{10}$ phase (hereinafter simply referred to as "Nd422" phase).

On the other hand, in the production of the Nd-Ba-Cu-O superconductors, even when the starting materials are synthesized to have deviated compositions and they are subjected to the aforementioned conventional melting processes for producing the other RE123 superconductors, the Nd422 phases (i.e., the non-superconductive phases) remain in the Nd123 phases (i.e., the superconductive phases), but they were not dispersed finely therein. Thus, the structure is hardly established, structure which can effectively improve the Jc of the RE123-based oxide superconductors in the regions of low magnetic field. Namely, non-superconductive precipitates, such as the RE211 phases, are little dispersed finely in the resulting structure of the Nd123 grain.

Thus, the Nd123 reported so far exhibited a high Jc in the regions of high magnetic field, Jc which is effected by their own magnetic-field-induced pinning centers. However, they have suffered from the problem in that they exhibit a Jc lower than that of the other RE123 in the regions of low magnetic field.

SUMMARY OF THE INVENTION

It is therefore an object of the present invention to provide a novel Nd-Ba-Cu-O superconductor which can maintain a high Jc, comparable with that of the conventional Nd-Ba- Cu-O superconductors, in the regions of high magnetic field, and which can remarkably improve the inferior Jc exhibited by the conventional Nd-Ba-Cu-O superconductors in the regions of low magnetic field. It is another object of the present invention to provide a process for producing the novel Nd-Ba-Cu-O superconductor.

An Nd-Ba-Cu-O bulk superconductor according to the present invention can carry out the aforementioned object, and comprises:

oxide including metallic elements of neodymium (Nd), barium (Ba) and copper (Cu); and having a structure including crystalline grains of Nd123 (i.e., an abbreviation of substance expressed by a chemical formula, $NdBa_2Cu_3O_x$), the Nd123 including the metallic elements, Nd, Ba and Cu, in a composition ratio of about 1:2:3, and fine particles of Nd422 (i.e., an abbreviation of substance expressed by a chemical formula, $Nd_4Ba_2Cu_2O_{10}$), the Nd422 including the metallic elements, Nd, Ba and Cu, in a composition ratio of about 4:2:2, the fine particles having an average particle diameter of 50 $\mu$m or less and being dispersed uniformly in the Nd123 crystalline grains.

The thus constructed present Nd-Ba-Cu-O bulk superconductor exhibits a Jc as high as that of the conventional RE-Ba-Cu-O melt-textured bulk superconductors in the regions of low magnetic field, because it has the structure in which the Nd422 phases, working as the pinning centers, are precipitated finely in large crystalline grains of the Nd123 phases. Further, the present Nd-Ba-Cu-O bulk superconductor exhibits a Jc as high as that of the conventional Nd-Ba-Cu-O bulk superconductors in the regions of high magnetic field. As a result, the present Nd-Ba-Cu-O bulk superconductor has good superconductivity over a wide range of external magnetic field. Furthermore, contrary to the conventional RE-Ba-Cu-O melt-textured bulk superconductors, the present Nd-Ba-Cu-O bulk superconductors can establish the structure in which the pinning centers are finely dispersed without employing noble metal elements. Note that, in the present Nd-Ba-Cu-O bulk superconductor, the fine particles of Nd422 can preferably have an average particle diameter of from 10 nm to 3 $\mu$m.

A production process according to the present invention can produce the present Nd-Ba-Cu-O bulk superconductor. The present process is for producing a bulk superconductor including oxide, the oxide including metallic elements of neodymium (Nd), barium (Ba) and copper (Cu), the process comprising the steps of:

preparing a mixture powder by mixing a first powder with a second powder, the first powder including Nd123, the Nd123 including the metallic elements, Nd, Ba and Cu, in a composition ratio of about 1:2:3, and the second powder including Nd422, the Nd422 including the metallic elements, Nd, Ba and Cu, in a composition ratio of about 4:2:2; and thermally treating the mixture powder by heating the mixture powder in atmosphere where a partial pressure of oxygen occupies 1% or less of atmosphere, and in a temperature range where the first powder melts partially at least but the second powder hardly melts in order to partially melt the mixture powder, and thereafter by gradually cooling the partially melted mixture powder in a temperature range around a solidifying point of the first powder, thereby forming a melt-textured bulk superconductor whose structure includes at least one crystalline grain of Nd 123 and fine particles of the second powder, where the fine particles are dispersed uniformly in the crystalline grains of Nd 123.

In the present production process, the Nd-Ba-Cu-O bulk superconductor with good characteristic can be produced by a series of reactions during the thermal treatment described below.

First of all, the mixture powder pressed into a pellet-shaped compaction. In the compaction, the particle size distributions of the Nd123 phase and the Nd422 phase are the same as in the mixture powder of the starting material.

In the first temperature-rising step, the particle size distributions of Nd 123 and Nd 422 phases, being present in the mixture powder prepared by the mixture-powder-preparing step, do not change essentially until the mixture powder is partially melted. When a combination of the oxides of Nd, Ba and Cu, or their compound is used as the starting material, some chemical reaction occurs during the first temperature-rising step. But, in the present production process, using Nd123 and Nd422 as the starting materials, they are stable and hardly react until the Nd123 is decomposed. When the temperature rises above a decomposition temperature of the Nd123, the Nd123 incongruently melts to Nd 422 and liquid phase including Ba, Cu, and O.

Thus, in the subsequent temperature-holding step, the partially melted compaction includes the solid phase of Nd 422 with two origins; namely: one is the Nd 422 particles which originally contained in the mixture powder; and the other is yielded by the incongruently melting of the Nd 123. Therefore, the particle size distribution of Nd 422 in the partially melted compaction depends on the original particle size distribution of the starting Nd 422 and Nd 123 powders (i.e., the mixture powder). In this temperature-holding step, the viscosity of the liquid phase in the partially melted compaction is kept high as the sufficient amount of solid phase (i.e., Nd 422) is included. Thus, the partially melted compaction can maintain its shape. Furthermore, contrary to the other RE123 oxide superconductor, the Nd 422 phase particles will not grow large even if no Pt, etc., is added. All in all, when the mixture powder including Nd 123 and Nd 422 is used for the starting material as in the present production process, the particle size distribution of Nd422 phase which is dispersed in the partially melted compaction, reflects the particle size distribution of the original mixture powder.

In the gradually-cooling step, large crystal grains of Nd 123 are grown from the partially melted compaction. The Nd123 phase receives the supply of Nd element, resulting from the decomposition of the Nd 422 phase, on the solidifying interface, and the supply of Ba and Cu elements, coming from the liquid phase on the solidifying interface. On the solidifying interface, there exist Nd422 phase particles excessively for the growth for the Nd123 grain, because, in the partially melted compaction, the Nd422 particles originate from not only the incongruent melting of Nd 123 but also the starting second powder.

The solidifying interface starts from the seed crystal. Then, with the progression of the solidifying interface during this gradually-cooling step started from just above a solidifying temperature of the Nd123 phase, large crystal grains of Nd123 are grown from the seed crystal in the partially melted compaction. After all, the thus solidified compaction is composed of large grains of Nd123 which contains a large number of Nd422 particles. The RE-Ba-Cu-O superconductor with a structure like this is called a melt-textured bulk. Therefore, the particle diameter distribution of Nd422 phase in the large grains of Nd 123 depends on the particle size distribution of Nd422 phase in the partially melted compaction which reflects the particle size distribution of the original mixture powder.

Eventually, the Nd-Ba-Cu-O melt-textured bulk (i.e., bulk superconductor) produced by the present process has the structure in which the fine particles of the Nd422 are dispersed in the large crystalline grains of the Nd123. In addition, the particle size distribution of the Nd422 reflects the particle size distribution of the original mixture powder. Therefore, when a fine composite powder is used for the starting material, the resulting melt-textured bulk can exhibit a higher Jc than that of the conventional Nd-Ba-Cu-O superconductors in the regions of low magnetic field.

Moreover, similarly to the conventional Nd-Ba-Cu-O superconductors, the resulting melt-textured bulk can also exhibit a higher Jc than that of the conventional rare-earth-element (other than Nd)-based melt-textured bulk in the regions of high magnetic field. This advantage stems from the arrangement that the composite powder is thermally treated under the low partial pressure of oxygen.

As having been described so far, the present Nd-Ba-Cu-O bulk superconductor and the present production process therefore can produce the following advantages; namely:

firstly, it is possible to provide an Nd-Ba-Cu-O bulk superconductor whose superconductive characteristic is improved remarkably over that of the conventional Nd-Ba-Cu-O bulk superconductors in the regions of low magnetic field. This advantage results from the arrangement that the Nd422 phases are dispersed finely in the crystalline grains of the Nd123 by employing the starting material including fine Nd422 and fine Nd 123 in advance;

secondly, it is possible to manufacture a bulk superconductor having desired shapes. This advantage stems from the arrangement that the second powder, included in the starting material, remains as solid phases when the first powder is incongruently melted in the thermally-treating step. The thus produced liquid phases exhibit a high viscosity, and accordingly can make a bulk material of improved shape-keeping capability; and thirdly, it is possible to provide test specimens or products with reduced costs, because, contrary to the conventional Y-based-oxide superconductors, the bulk superconductors of excellent superconductive characteristic can be manufactured without adding a noble metal, such as Pt, etc.

All in all, in accordance with the present invention, it is possible to provide oxide bulk superconductors, having better performance as well as desired dimensions and configurations, at further reduced costs.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Figure 1:
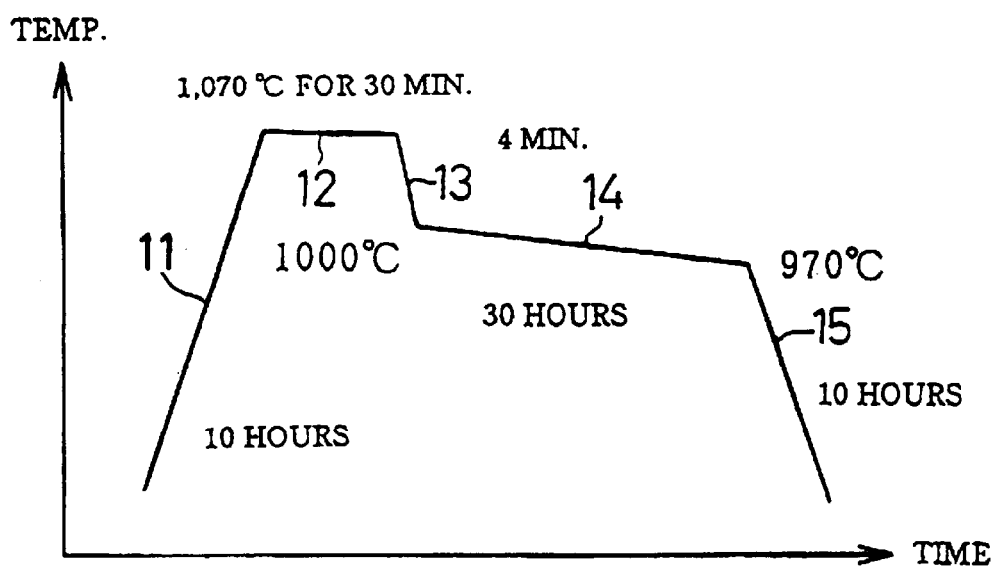
FIG. 1 is a timing chart for illustrating how temperatures were controlled in a thermally-treating step of a preferred embodiment of a production process according to the present invention.

Having generally described the present invention, a further understanding can be obtained by reference to the specific preferred embodiments which are provided herein for the purpose of illustration only and not intended to limit the scope of the appended claims.

A First Preferred Embodiment will be hereinafter described with reference to FIGS. 1 through 4, and is a process for producing an Nd-Ba-Cu-O bulk superconductor according to the present invention. Thereafter, a Second Preferred Embodiment will be described with reference to FIGS. 5 through 7, and is an Nd-Ba-Cu-O bulk superconductor produced by the First Preferred Embodiment.

First Preferred Embodiment

As a preferred embodiment of the present process for producing an Nd-Ba-Cu-O bulk superconductor, the present inventors carried out a production process. The production process included the steps of: a powder-mixing step; a molding step; a thermally-treating step; and an annealing step.

(Preliminary Step for Preparing Material Powders)

First of all, two different compounds of Nd-Ba-Cu-O powders (i.e., the first and the second powders) were prepared as raw materials for carrying out the preferred embodiment of the present production process.

The first powder included an $NdBa_2Cu_3O_x$ powder (i.e., Nd123), and was prepared in the following manner. For example, three metallic oxides, such as $Nd_2O_3$, $BaCO_3$ (or $BaO_2$) and CuO, were weighed out so that a molar ratio of the metallic elements (i.e., Nd, Ba and Cu) was Nd:Ba:Cu=1:2:3. The metallic oxides were mixed fully, and compacted by a pressure of 1 tonf/cm$^2$. Then, the resulting compaction was heated in a furnace in ambient atmosphere, and held in a temperature range of from 900 to 1,000° C. for 20 hours. After cooling the thus heated compaction in the furnace, the compaction was fully pulverized to be an $NdBa_2Cu_3O_x$ powder. The $NdBa_2Cu_3O_x$ powder had an average particle diameter of 10 $\mu$m or less was thus prepared. Note that the $NdBa_2Cu_3O_x$ powder can preferably have an average particle diameter of from 10 nm to 3 $\mu$m.

The second powder included an $Nd_4Ba_2Cu_2O_{10}$ powder (i.e., Nd422), had an average particle diameter of 10 $\mu$m or less as small as that of the first powder, and was prepared in the following manner. Note that the $Nd_4Ba_2Cu_2O_{10}$ powder can preferably have an average particle diameter of from 10 nm to 3 $\mu$m.

For instance, the three metallic oxides were weighed out so that a molar ratio of the metallic elements (i.e., Nd, Ba and Cu) was Nd:Ba:Cu=2:1:1. In the same manner as the preparation of the first powder, the metallic oxides were mixed, compacted, heated, and cooled. Thereafter, the resulting compaction was pulverized to prepare the second powder.

(Mixing Step)

In the mixing step, the first and the second powders were weighed out so that a molar ratio of them was 3:1, and were fully mixed in a mortar. Thus, a homogenous mixed powder was prepared in which the first and the second powders were mixed uniformly with each other.

(Molding Step)

In the molding step, the mixed powder was compacted by a pressure of 1 tonf/cm$^2$. A pellet-shaped compaction was thus prepared, and had a diameter of 20 mm, and a thickness of 10 mm.

(Thermally-treating Step)

Prior to the thermally-treating step, a single crystal of MgO was placed at the center on a surface of the pellet-shaped compaction so that its (100) plane contacted the surface. The single crystal was formed as a square having a side of 2 mm, and a thickness of 0.5 mm. Note that the single crystal operated as a seed crystal for growing crystals of the Nd123 phase in the gradual cooling of the thermally-treating step hereinafter described.

In the thermally-treating step, the compaction with the seed crystal placed was disposed in a quartz container. The quart container with the compaction disposed therein was placed in a furnace which had a temperature gradient of about 2° C./cm in the vertical direction. The compaction was then subjected to a thermal treatment.

The quartz container was connected with a quarts tube at the top. The quarts tube was for introducing a gas into the quartz container. The quarts container was ground flat at the bottom. The quartz container was disposed in a furnace so that there was formed a minute clearance between the bottom of the quartz container and a bed plate disposed in the furnace. For example, the quartz container can be one disclosed in Japanese Patent Application No. 7-243,169. The quartz container had a shape like a glass, and lay on a bet plate in the furnace. Accordingly, the introduced gas flowed out through the clearance during the thermal treatment. Note that, during the thermal treatment, an argon gas was introduced into the quartz container at a rate of 250 c.c. per minute, and that the argon gas included oxygen by a partial pressure of 1% or less of atmosphere.

As illustrated in FIG. 1, a temperature control was carried out in the thermally-treating step. The temperature control started at room temperature, and ended at room temperature via a temperature-increasing step 11, a partially-melting step 12, a first cooling step 13, a gradually-cooling step 14, and a second cooling step 15 in this order.

In the temperature-increasing step 11, the compaction was heated from room temperature to a maximum temperature for a period of 10 hours. The maximum temperature was set at 1,070° C. Note that the maximum temperature was far above the incongruently-melting point (e.g., 1,000° C.) of the first powder in the argon atmosphere, but did not reach the decomposition point of the second powder.

In the partially-melting step 12, the compaction was held at the maximum temperature (e.g., 1,070° C.) for 30 minutes. Note that, in the partially-melting step 12, the first powder component (i.e., $NdBa_2Cu_3O_x$) of the compaction incongruently melted to the solid Nd422 phases (i.e., the second-powder component), and the liquid phases including Ba, Cu, and O. Also note that, in the partially-melting step, the second-powder component (i.e., $Nd_4Ba_2Cu_2O_{10}$) of the compaction remained as its solid phases. Accordingly, in the partially-melting step 12, the compaction was put into a state where the liquid phases including Ba, Cu, and O, and the solid Nd422 phases were mixed with each other.

In the partially-melting step 12 of this First Preferred Embodiment, the compaction exhibited a sufficiently high viscosity, and kept the original pellet shape before starting the temperature-increasing step 11, because the second powder was present in an amount of 25% by molar ratio in the compaction. Moreover, due to the same reason, the fine particles of the second powder did not precipitate, but dispersed and floated uniformly in the liquid phases resulting from the incongruent melting of the first-powder component (i.e., $NdBa_2Cu_3O_x$).

In addition, contrary to the other conventional $RE_2BaCuO_5$, it was found that, when $Nd_4Ba_2Cu_2O_{10}$ which had been synthesized in advance was present, the grain growth could be inhibited without using the additives, such as platinum, etc., in the partially-melting step 12. Accordingly, the fine particles of the second powder dispersing and floating in the molten solution did not gather to produce coarse crystals or aggregates. Moreover, the fine particles did not separate nor sediment.

In the first cooling step 13, the partially-melted compactions was cooled rapidly to a temperature (e.g., 1,000° C.) for 4 minutes. Note that, the temperature was just above a solidifying point of the first-powder component ($NdBa_2Cu_3O_x$), and the first-powder component was in a state immediately before beginning to crystallize.

In the gradually-cooling step 14, the compaction, which had been rapidly cooled to 1,000° C., was cooled gradually to 970° C. by a temperature decrement of 1° C./hour. Thus, the first-powder component (i.e., $NdBa_2Cu_3O_x$) was grown to large crystalline grains. Note that it is preferable to gradually cool the compaction with a temperature gradient of 20° C./hour or less, further preferably with a temperature gradient falling in a range of from 0.5 to 3° C./hour.

Figure 2:
FIG. 2 is an actual photomicrograph for illustrating a crystalline structure of a preferred embodiment of an Nd-Ba-Cu-O bulk superconductor according to the present invention.
Figure 3:
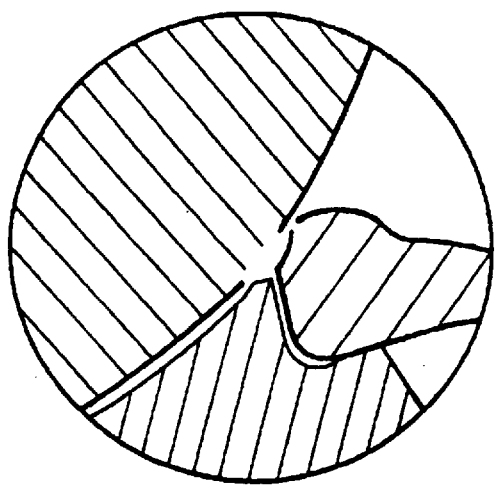
FIG. 3 is a rough sketch based on FIG. 2.

Consequently, as illustrated in FIGS. 2 and 3, the incongruently-melted compaction was transformed into a bulk superconductor which included large crystalline grains having a particle diameter of from 5 to 15 mm approximately. The large crystalline grains included crystalline grains which grew from the seed crystal. Note that, however, FIGS. 2 and 3 illustrate the melt-textured bulk which went through all the steps of the thermally-treating step of the First Preferred Embodiment, and that FIGS. 2 and 3 are an actual photomicrograph and a rough sketch which schematically depicted patterns arisen in the photomicrograph, respectively. Also note that the crystalline grains of the first-powder component (i.e., $NdBa_2Cu_3O_x$) can preferably have a particle diameter of from 5 to 15 mm (i.e., bulk diameter), and that the fine particles of the second-powder component (i.e., $Nd_4Ba_2Cu_2O_{10}$) can preferably have an average particle diameter of from 10 nm to 3 $\mu$m.

In the second cooling step 15, the melt-textured bulk was cooled from 970° C. to room temperature for 10 hours, and was taken out of the furnace. The thermally-treating step of the First Preferred Embodiment was thus completed.

(Annealing Step)

In the annealing step, the melt-textured bulk was put into another furnace, and was subjected to an oxygen-enrichment treatment. In the oxygen-enrichment treatment, the melt-textured bulk was heated in an oxygen gas flow.

Figure 4:
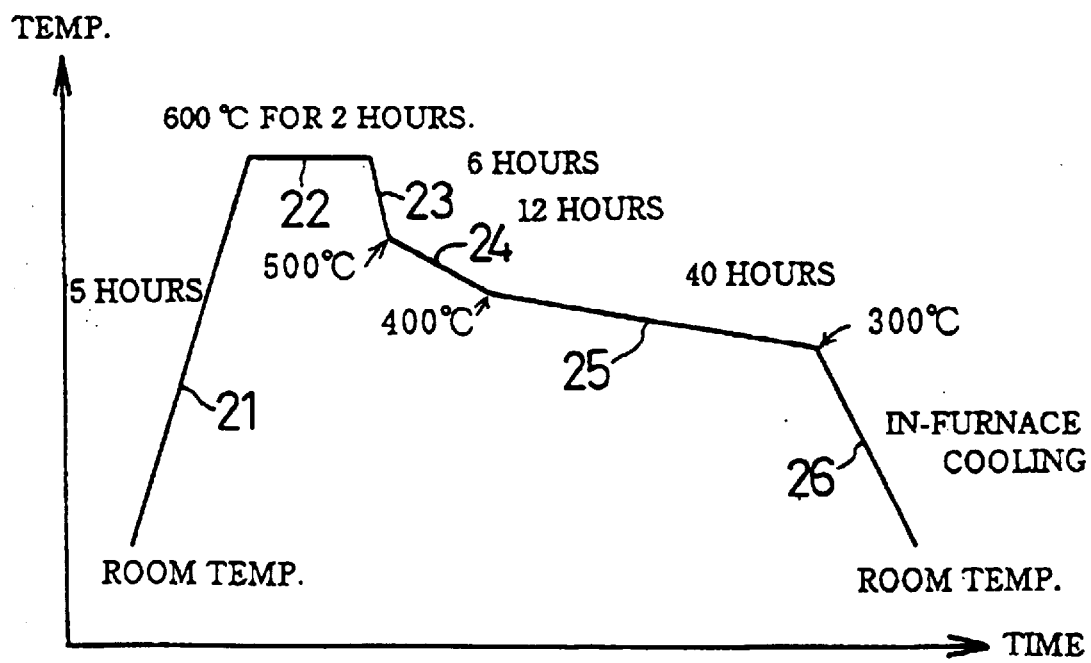
FIG. 4 is a timing chart for illustrating how temperatures were controlled in an annealing step of a preferred embodiment of a production process according to the present invention.

During the oxygen-enrichment treatment, a temperature control was carried out. As illustrated in FIG. 4, the temperature control included a temperature-increasing step 21, an elevated-temperature holding step 22, and a cooling step which were carried out in this order. In the temperature-increasing step 21, the melt-textured bulk was heated from room temperature to 600° C. for 5 hours. In the elevated-temperature holding step 22, the melt-textured bulk was held at 600° C. for 2 hours. In the cooling step, the melt-textured bulk was cooled from 600° C. for a long period of time. The cooling step included a first cooling step 23, a second cooling step 24, a third cooling step 25, and an in-furnace cooling step 26 which were carried out in this order. In the first cooling step 23, the melt-textured bulk was cooled from 600° C. to 500° C. for 6 hours. In the second cooling step 24, the melt-textured bulk was cooled from 500° C. to 400° C. for 12 hours. In the third cooling step 25, the melt-textured bulk was cooled from 400° C. to 300° C. for 40 hours. In the in-furnace cooling step 26, the melt-textured bulk was cooled from 300° C. to room temperature for 10 hours.

The test specimens produced by the production process of the First Preferred Embodiment where the Nd-Ba-Cu-O bulk superconductor according to the present invention, and exhibited superb superconductivity as hereinafter described.

Second Preferred Embodiment (On Structure)

Figure 5:
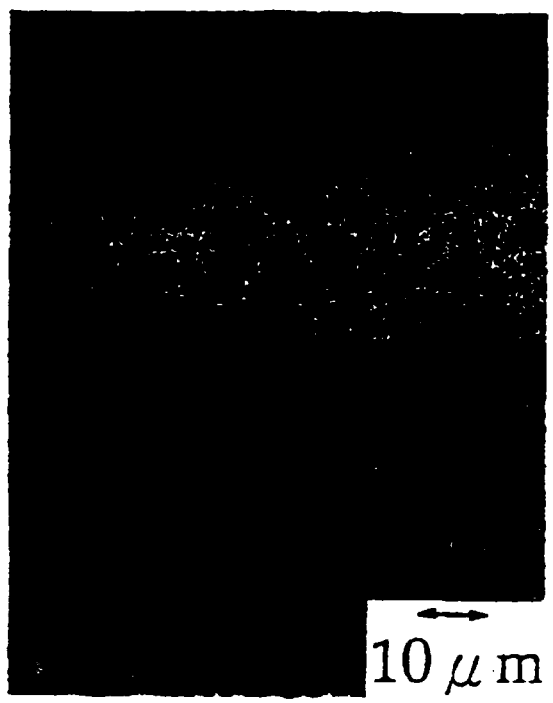
FIG. 5 is a photomicrograph taken by a polarizing microscope for illustrating a fine structure of a preferred embodiment of an Nd-Ba-Cu-O bulk superconductor according to the present invention.

The test specimens of the present Nd-Ba-Cu-O bulk superconductor produced by the production process of the First Preferred Embodiment had the following structure; namely: as illustrated in FIG. 5 (i.e., a photomicrograph taken by using a polarizing microscope), the fine particles of the Nd422 were dispersed evenly in the Nd123 matrix.

The Nd123 was $NdBa_2Cu_3O_x$, and the Nd422 was $Nd_4Ba_2Cu_2O_{10}$. In the test specimens, the Nd123 and the Nd422 were present in a molar ratio of 3:1. The matrix of Nd123 was large crystalline grains having a particle diameter of from 5 to 15 mm approximately. The fine particles of Nd422 were dispersed uniformly in the matrix, and had a particle diameter of from 0.5 to 10 $\mu$m approximately.

(On Superconductivity)

One of the coarsely-grown crystalline grains were cut off partially to prepare a test specimen for a superconductivity evaluation. The test specimen was examined for superconductivity by using an "SQUID" (i.e., Superconducting Quantum Interference Device).

Figure 6:
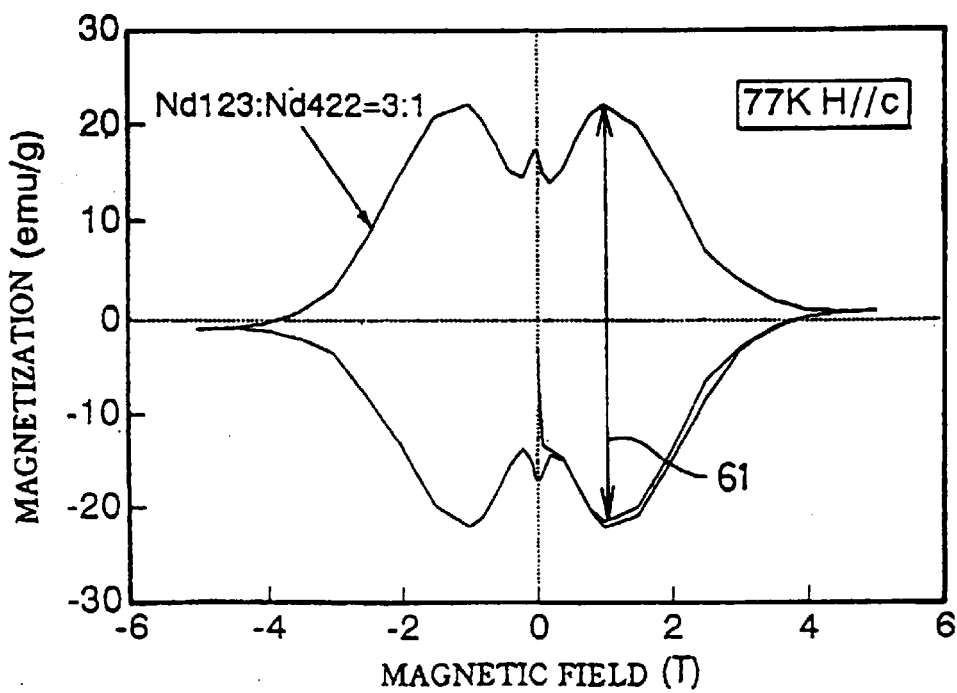
FIG. 6 is a graph for illustrating results of a measurement, using an "SQUID" (i.e., Superconducting Quantum Interface Device), to which a preferred embodiment of an Nd-Ba-Cu-O bulk superconductor according to the present invention was subjected.

For example, FIG. 6 illustrates the superconductivity examination in which a magnetic field was applied to the test specimen parallelly to a "c"-axis of the test specimen. In the drawing, the vertical axis specifies a magnetization with respect to a unit weight of the test specimen. The Jc appears in proportion to a width $\Delta M$ of the hysteresis of the magnetization curves. For instance, when an external magnetic field of 1 T is applied, the Jc is calculated from a length of the double-headed arrow 61. The test specimen of this Second Preferred Embodiment exhibited Jc even in the regions of a high magnetic field of 4 T or more, because $\Delta M$ was larger than zero (i.e., $\Delta M>0$) even when a magnetic field of 4 T or more is applied to the test specimen. Thus, similarly to the conventional Nd-Ba-Cu-O bulk superconductors, the test specimen had good superconductivity in the regions of high magnetic field.

Figure 7:
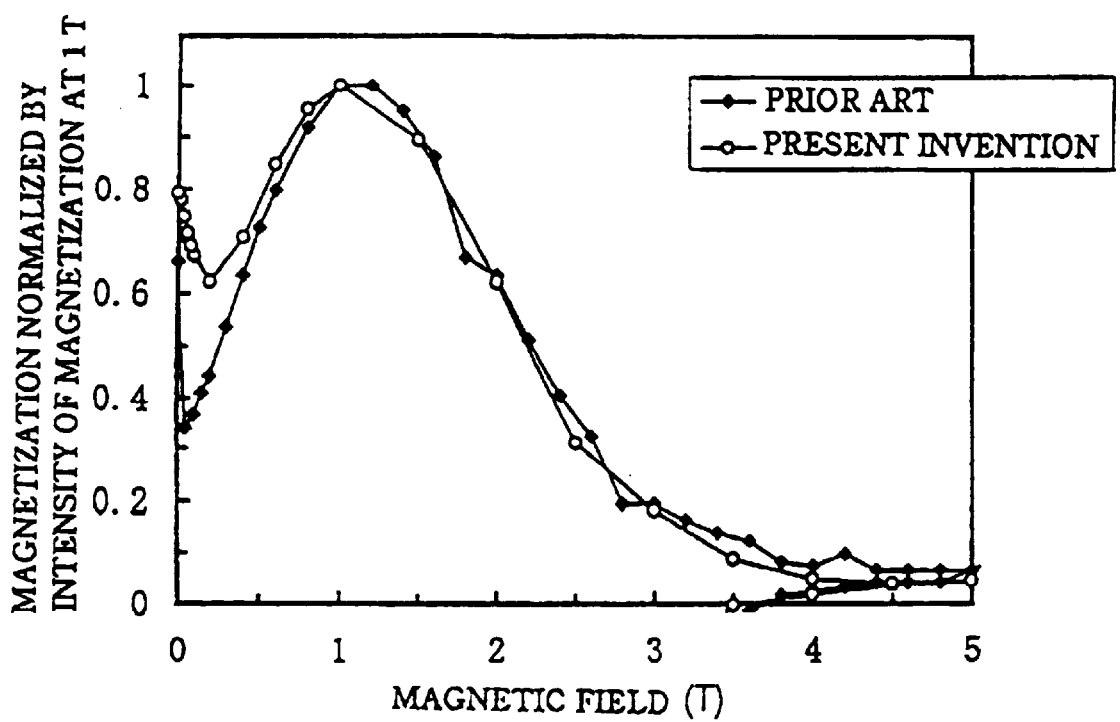
FIG. 7 is a graph for comparing performance of a preferred embodiment of an Nd-Ba-Cu-O bulk superconductor according to the present invention with that of a conventional Nd-Ba-Cu-O bulk superconductor.

FIG. 7 illustrates a comparison of a magnetization curve, which was exhibited by the test specimen of the present Nd-Ba-Cu-O bulk superconductor, with a magnetization curve, which was exhibited by a conventional Nd-Ba-Cu-O bulk superconductor. The magnetization curves were normalized by the maximum intensity of magnetization when an external magnetic field of 1 T was applied. At 1 T, the magnetization curves showed a peak. As illustrated in FIG. 7, the conventional Nd-Ba-Cu-O bulk superconductor exhibited intensities of magnetization which were degraded to about ⅓ the peak value in the regions of low magnetic field. On the other hand, the test specimen of the present Nd-Ba-Cu-O bulk superconductor exhibited intensities of magnetization which retained about 60% or more of the peak value in the regions of low magnetic field. It is thus apparent that the test specimen of the present Nd-Ba-Cu-O bulk superconductor bulk had a remarkably improved superconductive characteristic in the regions of low magnetic field, for instance, 1 T or less, in particular 0.5 T or less.

Hence, in accordance with the present invention, it is possible to make an Nd-Ba-Cu-O bulk superconductor which can hold a high Jc comparable with that of the conventional Nd-Ba-Cu-O bulk superconductors in the regions of high magnetic field, and which can exhibit a sharply enhanced Jc over inferior Jc of the conventional Nd-Ba-Cu-O bulk superconductors in the regions of low magnetic field.

Modified Version of the First Preferred Embodiment

It is possible to modify the process for producing the present Nd-Ba-Cu-O bulk superconductor according to the First Preferred Embodiment as hereinafter described.

For example, it is possible to carry out the thermally-treating step and the annealing step continuously. In many production facilities, the thermally-treating step and the annealing step are carried out independently by using different furnaces for different applications. The First Preferred Embodiment was carried out in this manner. Under the circumstance, after the furnace for the thermally-treating step is cooled completely, the intermediate product is transferred to the furnace for the subsequent annealing step, and is heated again. Accordingly, times are required for cooling the furnace for the thermally-treating step and raising the temperature of the furnace for the annealing step, and man-hour requirements are needed for transferring the intermediate product, and re-placing the intermediate product in the furnace.

Therefore, in this modified version, production facilities were arranged for carrying out the thermally-treating step. According to the production facilities, an inert gas and an oxygen gas could be supplied selectively to an identical furnace. Specifically, it was unnecessary to completely carry out the second cooling step 15 (shown in FIG. 1) of the thermally-treating step, in which the melt-textured bulk was cooled from 970° C. to room temperature. For example, the second cooling step 15 could be terminated at 600° C., and the gas supply was switched from an inert-gas supply to an oxygen-gas supply, and accordingly the second cooling step 15 could be changed directly to the elevated-temperature holding step 22 (shown in FIG. 4) of the annealing step.

As a result, the latter half of the second cooling step 15 of the thermally-treating step could be saved by a couple of hours, and the whole temperature-increasing step 21 of the annealing step could be saved by 5 hours entirely. Thus, it was possible to carry out the thermally-treating step facilitatively. Further, it was unnecessary to carry out the operation for transferring the intermediate product between the two furnaces. Accordingly, the man-hour requirements could be saved. Furthermore, it was unnecessary to prepare two independent furnaces. Consequently, the equipment costs, running costs, and occupied spaces stemming from two furnaces could be saved.

All in all, in accordance with the modified version, it is possible to carry out the process for producing the present Nd-Ba-Cu-O bulk superconductor less expensively, and for a shorter period of time.

Having now fully described the present invention, it will be apparent to one of ordinary skill in the art that many changes and modifications can be made thereto without departing from the spirit or scope of the present invention as set forth herein including the appended claims.

What is claimed is:

1. A neodymium-barium-copper-oxide (Nd-Ba-Cu-O) bulk superconductor, comprising:

an oxide of the metallic elements neodymium (Nd), barium(Ba) and copper (Cu) having a structure comprising crystalline grains of Nd123 having the formula $NdBa_2Cu_3O_x$, and fine particles of Nd422 having the formula: $Nd_4Ba_2Cu_2O_{10}$, the fine particles of Nd422 having an average particle diameter of 10 μm or less and being dispersed uniformly in the crystalline grains of Nd123 having a particle diameter of 5 mm or more, said bulk superconductor showing the capacity for trapping a magnetic field of more than 1 T on its surface when the magnetic field is trapped by the bulk superconductor below 77K.

2. The Nd-Ba-Cu-O bulk superconductor according to claim 1, wherein said crystalline grains have an oriented crystallographic-axis direction.

3. The Nd-Ba-Cu-O bulk superconductor according to claim 1, wherein said crystalline grains exhibit a critical current density (Jc) of more than 10,000 $A/cm^2$ when being exposed to a temperature of 77° K., and to an external magnetic field of 1 T.

4. The bulk superconductor of claim 1, wherein said Nd123 and Nd422 are present in a molar ratio of less than 3:1 to 2:3.

5. A neodymium-barium-copper-oxide (Nd-Ba-Cu, O) bulk superconductor, comprising:

an oxide of the metallic elements neodymium (Nd), barium(Ba) and copper (Cu) having a structure comprising crystalline grains of Nd123 having the formula: $NdBa_2Cu_3O_x$, and fine particles of Nd422 having the formula: $Nd_4Ba_2Cu_2O_{10}$, the fine particles of Nd422 having an average particle diameter of 10 μm or less and being dispersed uniformly in the crystalline grains of Nd123 having a particle diameter of 5 mm or more.

6. The bulk superconductor of claim 5, wherein said crystalline grains have an oriented crystallographic-axis direction.

7. The bulk superconductor of claim 5, wherein said crystalline grains exhibit a critical current density (Jc) of more than 10,000 $A/cm^2$ when being exposed to a temperature of 77° K., and to an external magnetic field of 1 T.

8. A process for producing a bulk superconductor including oxide, the oxide including metallic elements of neodymium (Nd), barium (Ba) and copper (Cu), the process comprising the steps of:

preparing a mixture powder by mixing a first powder with a second powder, the first powder including Nd123, the Nd123 oxide including the metallic elements, Nd, Ba and Cu, in a composition ratio of about 1:2:3, and the second powder including Nd422, the Nd422 including the metallic elements, Nd, Ba and Cu, in a composition ratio of about 4:2:2; and thermally treating the mixture powder by heating the mixture powder in atmosphere where a partial pressure of oxygen occupies 1% or less of atmosphere, and in a temperature range where the first powder melts partially at least but the second powder hardly melts in order to partially melt the mixture powder, and thereafter by gradually cooling the partially melted mixture powder in a temperature range around a solidifying point of the first powder, thereby forming a melt-textured bulk superconductor whose structure includes at least one crystalline grain of Nd123 and fine particles of the second powder, where the fine particles are dispersed uniformly in the crystalline grains of Nd123.

9. The product produced by the process of claim 8.

10. The process according to claim 8, wherein, in said mixture-powder-preparing step, each of said first powder and said second powder is synthesized in advance, and is mixed to prepare said mixture powder.

11. The product produced by the process of claim 10.

12. The process according to claim 8, wherein said mixture-powder-preparing step includes a step of choosing said first and said second powders having an average particle diameter of 10 μm or less.

13. The product produced by the process of claim 12.

14. The process according to claim 8, wherein, in said mixture-powder-preparing step, said first powder and said second powder are prepared in a molar ratio falling in a range of from 20:1 to 2:3.

15. The product produced by the process of claim 14.

16. The process according to claim 8 further comprising, after said mixture-powder-preparing step, a step of pressurizing and molding said mixture powder to a compaction having a desirable size and shape.

17. The product produced by the process of claim 16.

18. The process according to claim 8 further comprising, before or in said thermally-treating step, a step of disposing at least one member selected from the group consisting of a nuclei-forming particle and a seed crystal for forming nuclei of said crystalline grains on a surface or inside of said mixture powder.

19. The product produced by the process of claim 18.

20. The process according to claim 8, wherein, in said thermally-treating step, a temperature of said heating is held between a peritectic point of said first powder and a peritectic point of said second powder for a certain period of time, and said partially melted mixture powder is gradually cooled with a temperature decrement of 20° C./hour or less from a temperature above the temperature at which said partially melted mixture powder starts to crystallize.

21. The product produced by the process of claim 20.

22. The process according to claim 8 further comprising, after said thermally-treating step, a step of annealing to enrich an oxygen content of said melt-textured bulk superconductor by heating said melt-textured bulk superconductor in an oxygen gas flow or in an oxygen-rich atmosphere.

23. The product produced by the process of claim 22.

24. The process according to claim 22, wherein, in said annealing step, a maximum temperature of said melt-textured bulk superconductor is kept in a range of from 200 to 600° C. for 1 hour or more.

25. The product produced by the process of claim 24.

* * * * *